US006756084B2

(12) United States Patent
Fulton et al.

(10) Patent No.: US 6,756,084 B2
(45) **Date of Patent: *Jun. 29, 2004**

(54) ELECTROSTATIC DEPOSITION OF PARTICLES GENERATED FROM RAPID EXPANSION OF SUPERCRITICAL FLUID SOLUTIONS

(75) Inventors: John L. Fulton, Richland, WA (US); George Deverman, Richland, WA (US)

(73) Assignee: Battelle Memorial Institute, Richland, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/157,626

(22) Filed: May 28, 2002

(65) Prior Publication Data

US 2003/0222019 A1 Dec. 4, 2003

(51) Int. Cl.[7] .................................................. B05D 1/12

(52) U.S. Cl. ............................. 427/458; 239/3; 264/10; 427/180; 427/421; 428/323; 428/332

(58) Field of Search .............................. 264/10, 12, 13; 239/8, 690.01, 691, 704–708, 310, 13, 690; 118/620, 621, 624, 626; 428/323, 327, 332; 210/634, 774; 427/180, 421, 422, 457, 458; 502/9; 424/489

(56) References Cited

U.S. PATENT DOCUMENTS

| | | | | | |
|---|---|---|---|---|---|
| 4,582,731 A | | 4/1986 | Smith | 427/421 |
| 4,734,227 A | | 3/1988 | Smith | 264/13 |
| 4,734,451 A | | 3/1988 | Smith | 264/12 |
| 4,882,107 A | * | 11/1989 | Cavender et al. | 264/51 |
| 5,088,443 A | * | 2/1992 | Hastings et al. | 118/314 |
| 5,106,650 A | | 4/1992 | Hoy et al. | 427/385.5 |
| 5,211,342 A | | 5/1993 | Hoy et al. | 427/385.5 |
| 5,212,229 A | * | 5/1993 | Taylor et al. | 524/556 |
| 5,290,603 A | | 3/1994 | Nielsen et al. | 427/421 |
| 5,639,441 A | | 6/1997 | Sievers et al. | |
| 5,708,039 A | | 1/1998 | Daly et al. | |
| 5,795,626 A | * | 8/1998 | Gabel et al. | 427/258 |
| 5,871,373 A | * | 2/1999 | Pacini et al. | 427/258 |
| 5,981,474 A | * | 11/1999 | Manning et al. | 424/489 |
| 5,981,696 A | | 11/1999 | Saatweber et al. | |
| 6,124,226 A | | 9/2000 | Nielsen et al. | 264/9 |
| 6,475,571 B1 | * | 11/2002 | Echigo et al. | 427/258 |

FOREIGN PATENT DOCUMENTS

| | | |
|---|---|---|
| EP | 0 370 268 A2 | 10/1989 |
| EP | 0 421 796 A2 | 10/1990 |
| EP | 0 506 067 A1 | 3/1992 |
| WO | WO 99/19085 A1 | 4/1999 |
| WO | WO 01/24917 A1 | 4/2001 |
| WO | WO 01/32951 A2 | 5/2001 |
| WO | WO 01/83873 A1 | 11/2001 |
| WO | WO 01/87368 A1 | 11/2001 |
| WO | WO 01/94031 A2 | 12/2001 |

OTHER PUBLICATIONS

Mi et al., "A new study of glass transition of polymers by high pressure DSC," *Polymer* 39(16):3709 (1998).

Rindfleisch et al., "Solubility of Polymers and Copolymers in Supercritical $CO_2$," *J. Phys. Chem.* 100:15581–15587 (1996).

(List continued on next page.)

*Primary Examiner*—Joseph Drodge
(74) *Attorney, Agent, or Firm*—Klarquist Sparkman, LLP

(57) ABSTRACT

A method for depositing a substance on a substrate that involves forming a supercritical fluid solution of at least one supercritical fluid solvent and at least one solute, discharging the supercritical fluid solution through an orifice under conditions sufficient to form solid particles of the solute that are substantially free of the supercritical fluid solvent, and electrostatically depositing the solid solute particles onto the substrate. The solid solute particles may be charged to a first electric potential and then deposited onto the substrate to form a film. The solute particles may have a mean particle size of less than 1 micron.

11 Claims, 5 Drawing Sheets

OTHER PUBLICATIONS

Smith et al., "Performance of Capillary Restrictors in Supercritical Fluid Chromatograpy," *Anal. Chem.* 58:2057–2064 (1986).

Tuminello et al., "Dissolving Perfluoropolymers in Supercritical Carbon Dioxide," *Macromolecules* 28:1506–1510 (1995).

Zhong et al., "High–pressure DSC study of thermal transitions of a poly(ethylene terephthalate)/carbon dioxide system," *Polymer* 40:3829–3834 (1999).

Jung et al., "Particle design using supercritical fluids: Literature and patent survey," *Journal of Supercritical Fluids* 20:179–219 (2001).

Matson et al., "Rapid Expansion of Supercritical Fluid Solutions: Solute Formation of Powders, Thin Films, and Fibers," *Ind. Eng. Chem. Res.* 26:2298–2306 (1987).

* cited by examiner

ELECTROSTATIC DEPOSITION OF PARTICLES GENERATED FROM RAPID EXPANSION OF SUPERCRITICAL FLUID SOLUTIONS

FIELD

This application relates to methods for electrostatically depositing a substance on a substrate.

BACKGROUND

The rapid expansion of supercritical fluid solutions through a small orifice (referred to herein as the "RESS" process) produces an abrupt decrease in dissolving capacity of the solvent as it is transferred from a supercritical fluid state, having near liquid density, to a very low density phase after the expansion. This abrupt transition in solvent characteristics results in the nucleation and growth of nanometer-sized particles from any low vapor pressure solute species that are dissolved in the solution prior to expansion. Because the solvent is transformed into the gas phase during the RESS expansion, RESS products are generated "dry" since they are substantially free of residual solvent. A long-standing difficulty with the RESS process is that particles in the range from 10–500 nm are difficult or impossible to deposit on a surface since their extremely low mass causes them to remain entrained in the expansion gas.

Electrostatic deposition has been used in connection with spraying of liquid compositions. In such conventional systems, the spray composition is in the liquid state at the spray nozzle exit tip. Mechanical forces (shear forces in the nozzle) cause the breakup of the liquid stream into smaller droplets of at least one micron or larger. Liquid spraying is not a true thin film technique since relatively large particles or agglomerations of molecules actually impact the substrate surface. During the electrostatic charging process at the nozzle tip, charge can be transferred through the liquid or from the nozzle surface to the liquid surface. This charge is then transferred to the individual droplets as they form during the droplet breakup process.

A continuing need exists for environmentally benign methods for producing nanometer-thick films on substrates. Most conventional methods use environmentally problematic volatile organic solvents, do not offer sufficient film thickness and uniformity control, and/or are costly. Methods that can combine the environmental benefits of RESS with the need for uniform nanometer-thick films would be quite useful.

SUMMARY OF THE DISCLOSURE

Disclosed herein are methods that can be used to produce thin films or coatings on a substrate. One method embodiment involves forming a supercritical fluid solution of at least one supercritical fluid solvent and at least one solute, discharging the supercritical fluid solution through an orifice under conditions sufficient to form solid particles of the solute that are substantially free of the supercritical fluid solvent, and electrostatically depositing the solid solute particles onto the substrate. One aspect of this embodiment contemplates charging the solid solute particles to a first electric potential and depositing the charged solid solute particles onto a substrate to form a film. Substrates having at least one surface upon which such a film has been deposited are also disclosed.

A further embodiment involves forming a solution of at least one supercritical fluid solvent and at least one solute, discharging the solution through an orifice under conditions sufficient to form particles of the solute having a mean particle size of less than 1 micron, and electrostatically depositing the solute particles onto the substrate.

An additional disclosed embodiment includes forming a mixture of at least one supercritical fluid and about 3.0 weight percent or less of at least one polymer (based on the total weight of the supercritical fluid and the polymer), flowing the mixture through an orifice to produce a spray that includes particles of the polymer, and electrostatically depositing the polymer particles onto the substrate.

Also disclosed are methods for collecting bulk powders that involves collecting the solid solute particles that are electrostatically deposited on a substrate.

The disclosed methods will become more apparent from the following detailed description of several embodiments.

BRIEF DESCRIPTION OF THE DRAWINGS

Certain embodiments will be described in more detail with reference to the following drawings.

DETAILED DESCRIPTION OF SEVERAL EMBODIMENTS

Figure 1:
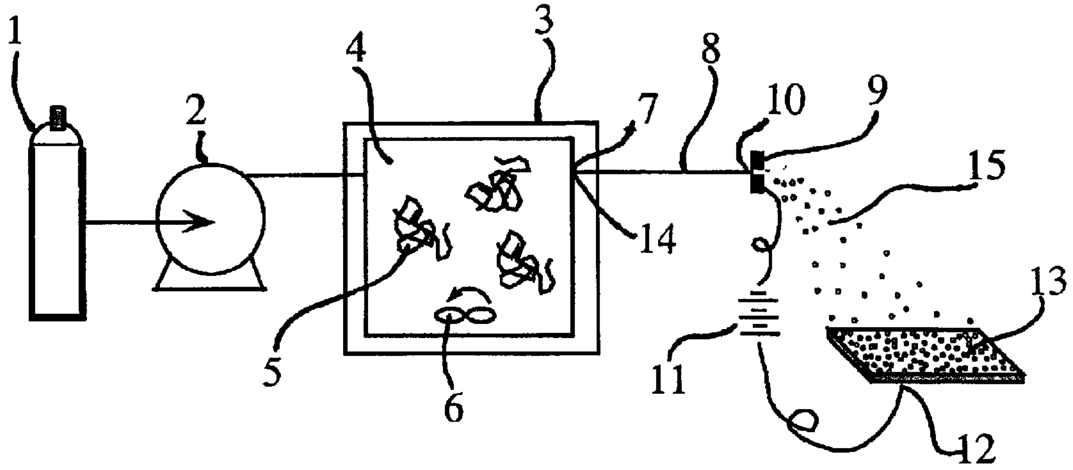
FIG. 1 is a schematic diagram of a representative apparatus for performing the presently described method.

For ease of understanding, the following terms used herein are described below in more detail:

"Nanometer" or "nanometer-sized" denotes a material or construct whose largest dimension is less than one micron. For example, "nanometer-sized" particles have a mean particle size of less than 1 micron. Similarly, "nanometer film thickness" denotes a film thickness less than about 1 micron.

"Supercritical fluids" relate to materials that are at a temperature and pressure such that they are at, above, or slightly below their critical point. Thus, supercritical fluids may include near-supercritical fluids. For example, the supercritical fluid may be a substance that is a gas at standard temperature and pressure (i.e., about 1 atmosphere and 25° C.), but is at a density greater than a critical density of the gas. The supercritical fluid may be a substance that is a liquid at standard temperature and pressure, but is at a temperature greater than a critical temperature of the liquid and at a pressure greater than a critical pressure of the liquid. When a fluid is maintained in a near critical state, its preferred temperature is in a range from about 0.7 times the critical temperature thereof, up to the critical temperature thereof.

The above term descriptions are provided solely to aid the reader, and should not be construed to have a scope less than that understood by a person of ordinary skill in the art or as limiting the scope of the appended claims.

The RESS process is generally described in U.S. Pat. Nos. 4,582,731; 4,734,227; and 4,734,451. In particular, the RESS process involves dissolving at least a portion of a solute material in a supercritical fluid solvent. The resulting solution is maintained in a supercritical fluid state and then released (and initially expanded) through an orifice and into a relatively lower pressure region (i.e., approximately atmospheric or subatmospheric). A single homogeneous supercritical phase exists up to the inlet or proximate end of the orifice. The particle formation occurs primarily beyond the exit tip or distal end of the orifice. In this region the high-pressure fluid undergoes an expansion to gas densities in extremely short times (e.g., less than about $10^{-5}$ s). Homogeneous nucleation occurs in this rapid expansion that leads to formation of nanometer-sized particles. In the transition region from the exit tip out to approximately 1 mm beyond the exit tip, the fluid accelerates to sonic velocities forming a shock wave. This involves a phase transition from a single supercritical fluid phase to a two-phase system of either vapor/solid or vapor/liquid.

The effectiveness of the presently disclosed electrostatic deposition methods is surprising in light of the above-described severe phase transition regime. Specifically, in the region beyond the orifice exit tip where the particles are forming, more gas-like conditions exist with extremely high particle velocities. Prior to the present disclosure, the likelihood of sufficient charge conduction through a gas-like phase traveling over very short distances at near sonic velocity would be viewed as highly improbable. Moreover, the electrical conductivity of the supercritical fluid solution is dramatically lower compared to a liquid phase solution as used in conventional electrostatic spraying. A lower electrical conductivity means that it is more difficult for charge transfer to occur.

Electrostatic deposition takes advantage of the phenomenon that particles charged at a first potential are electrostatically attracted to a substrate that is held at a second potential or at electric ground. The particles may be subjected to an external electrical field via any suitable technique. One particularly useful approach involves applying a high voltage to the expansion nozzle to charge the RESS particles as they are being formed. In both embodiments, the electrostatic attraction between the RESS particles and the substrate forces the particles to the substrate surface.

An option for charging the particles involves providing an electrode or an array of electrodes that can generate an electrical field that is applied to the particles. For example, the particles may be subjected to the electrical field after they exit the expansion orifice by placing an electrode near the orifice exit. Indeed, it has been found that the most efficient deposition occurs if the electrode is located within about 0.1 mm to about 1 cm of the orifice outlet, preferably within about 0.75 mm. Alternatively, the expansion orifice could be constructed from a conducting material that is itself charged. The charge then can be transferred to the solute material as it passes through the orifice via generation of charged species in the supercritical solution due to the high field strengths in the vicinity of the expanding jet. The electrode may be charged to any suitable voltage that results in the desired field strengths for deposition. For example, the field strength may range from about 0.1 kV/cm to about 75 kV/cm, more particularly from about 1 kV/cm to about 10 kV/cm. Additional methods for particle charging include generating a corona discharge in the expanding supercritical solution jet. The applied electrode voltage may be substantially constant, modulated or stepped. Modulating or stepping of the voltage enhances particle coating on the interior surfaces of objects that define voids such as cylindrical structures.

The substrate may be charged at a potential that is opposite that of the particles or at a potential that is the same sign as the particles but at a lower or higher voltage. Alternatively, the substrate may be grounded. Any technique may be utilized to charge the substrate. For example, an electrode may be in electrical contact with the substrate or an array of electrodes may serve as the substrates. According to a further embodiment, the substrate may be sufficiently electrically isolated so that an electrostatic charge can be accumulated on the substrate. One technique of accumulating the charge is by taking advantage of the photoelectric effect. In this method the substrate is exposed to electromagnetic radiation effective to strip charges, typically electrons, from the surface of the substrate. Other methods include induction charging or tribocharging, plasma treatment, corona charging, and ion implantation. Another method of electrostatically depositing charged deposition materials to a surface has been termed "controlled field deposition," and typically involves applying a potential to an electrode which directly or indirectly results in the formation of an attractive electrical field at the surface upon which charged material will be deposited. For example, a substrate can have electrical conductors positioned below the deposition surfaces, and a potential applied to the conductors results in the formation of an attractive field at the surface.

As mentioned above, nanometer-sized particles (or "nanoparticles") are generated during the rapid expansion of supercritical fluid solutions. For example, the mean particle size may be less than 1 micron. According to certain embodiments, the mean particle size may be from about 20 nm to about 200 nm. Collection of such nanometer-sized particles is difficult with conventional systems since the particles tend to follow gas stream lines or remain suspended in gases. The disclosed methods solve this problem.

The size of the particles are so small that they can be deposited to electrically conducting microscopic regions with a deposition resolution better than 50 nm. According to certain embodiments, a deposition resolution of approximately 50 million dots of deposited substance/inch can be achieved. This characteristic of the process allows one to create intricate designs on a substrate by embedding an intricate pattern of conducting material in a nonconducting substrate. The particles will only coat the conducting material pattern and not the adjoining nonconducting substrate.

The particles can have varying shapes depending upon the solute material and the process conditions. For example, the particles may be substantially spherical, irregularly shaped, rod-shaped or fibrous in shape. The fibers may have an aspect ratio ranging from about 10 to more than one thousand, with diameters of about 0.01 $\mu$m to about 1 $\mu$m.

According to one variant of the electrodeposition methods, the particles generated by the RESS process are solid particles of the solute that are substantially free of the supercritical fluid solvent. Solid particles typically are produced when the solute material exists as a solid at ambient conditions (i.e., 25° C. and 1 atmosphere). In another variant, the particles generated by the RESS process are liquid particles or droplets of the solute that are substantially free of the supercritical fluid solvent. Liquid droplets typically are produced when the solute material exists as a liquid at ambient conditions. Examples of such liquid solutes include organosiloxanes such as polydimethylsiloxane, polyethylene glycol dodecyl ether, decanoic acid, octanol, 2-octanone, n-dodecane, and perfluorodecane.

Modifying the RESS process as described in U.S. Pat. No. 4,734,227 can produce fiber-shaped particles. In particular, the RESS process is modified so that the solute passes briefly through an intermediate liquid phase, rather than directly to a solid, from the solution. One way to do this is to raise the solution temperature to just above the melting point of the solute. Another is to use a small amount (<20 weight %) of a supercritical solvent modifier or entrainer having a higher critical temperature than the main solvent component and substantial solubility with the polymer. Acetone provides a suitable such secondary solvent or co-solvent for many classes of polymers and others can be readily determined. The concentration of the secondary solvent should be sufficiently low that, upon expansion through the orifice and vaporization of the primary supercritical solvent, particles of a low-viscosity solution of the polymer and secondary supercritical fluid solvent are initially formed within the nozzle. The latter technique is used with normally solid solutes that do not have appropriate melting points for use with a single supercritical solvent.

The electrodeposited coatings may be characterized by the initial formation of a coating of individual RESS nanoparticles. The RESS nanoparticles can undergo rapid flow and amalgamate or coalesce with adjacent particles due to their high surface energy. The resulting film may have a substantially uniform thickness wherein nanometer-sized voids or pinholes are substantially absent. The electrodeposited coatings may be further cured or treated to enhance their filmogenic characteristics such as uniformity, chemical activity or resistivity, and physical properties (e.g., surface tension, hardness, optical, etc.). Illustrative subsequent treatments include heating, radiation curing such as UV curing, moisture curing, and aerobic or anaerobic curing.

A further feature of the presently described methods is the ability to precisely control the deposition so that almost any desired film thickness can be produced. For example, film thickness of less than about 500 nm, particularly less than about 20 nm, can be achieved. Maximum achievable film thickness are essentially unlimited, but generally can be up to about 10 microns, particularly about 1 micron, thick. The film thickness may be primarily controlled by the length of time of electrostatic deposition. Other factors that may control the film thickness include concentration of the solute in the supercritical solution, the diameter of an orifice through which the supercritical solution is discharged, and the electrostatic deposition field strength.

The amount of solute material or substance mixed with the supercritical solvent may vary, provided the resulting mixture forms a supercritical solution. In general, about 3.0 weight percent or less of a solute, more particularly about 1.0 weight percent or less, most particularly about 0.1 weight percent or less, based on the total weight of the supercritical fluid and the solute combined, is mixed with the supercritical solvent. The minimum amount of solute could range down to about 0.005 weight percent. The viscosity of the sprayed supercritical solution is approximately the same or slightly above the viscosity of the supercritical solvent itself. For example, the viscosity of a supercritical solution that includes $CO_2$ as the solvent according to the presently disclosed methods is about 0.08 centipoise at 60° C. and 300 absolute bar, and is about 0.10 centipoise at 110° C. and 900 absolute bar.

The substances (or a suitable precursor) that may be electrostatically deposited include any substances that can sufficiently dissolve in a supercritical fluid solvent. Illustrative materials include polymers (organic and organometallic), non-polymeric organic materials (dyes, pharmaceuticals), non-polymeric inorganic materials (e.g., metals, metallic salts, alloys, etc), and combinations thereof. Examples of polymeric materials include poly(vinyl chloride), polyarylenes (e.g., polystyrene), polyolefins (e.g., polypropylene and polyethylene), fluoropolymers (e.g., perfluorinated polyethylene and other halogenated polyolefins), poly(carbosilane), poly(phenyl sulfone), polyacrylates (e.g., poly(methyl methacrylate), polymethylacrylate), polycaprolactone, polyamides, polyimides, and polyurethanes. Examples of inorganic materials include $SiO_2$, KI, $GeO_2$, AgI, chromium materials, copper materials, aluminum materials, nickel materials, palladium materials, and platinum materials. Examples of organic materials include anthracene, benzoic acid, caffeine, cholesterol, and flavones. Examples of pharmaceutical compounds include aspirin, ibuprofen, alpha-tocopherol, stimasterol, anti-inflammatory agents (e.g., steroids), antibiotics, anti-viral agents, anti-neoplastic agents (e.g., etoposide), and antihistamines.

The supercritical fluid solvent may be any supercritical fluid that has solvating properties. Illustrative substances include carbon dioxide, hydrocarbons, ammonia, ethylene, acetone, diethyl ether, $N_2O$, xenon, argon, sulfur hexafluoride and water. Examples of hydrocarbons include alkanes (e.g., ethane, propane, butane and pentane), alkenes (ethylene, propylene, and butene), alkanols (e.g., ethanol, methanol, isopropanol, and isobutanol), halogenated hydrocarbons (e.g., chlorotrifluoromethane, chlorodifluoromethane and monofluoromethane), carboxylic acids (e.g., acetic acid and formic acid), fluorinated compounds (perfluorooctanol, perfluorohexane, and 2,3-dihydrodecafluoropentane), aromatic compounds (e.g., benzene, toluene, m-cresol, o-xylene, pyridine, aniline, decahydronapbthalene, and tetrahydronaphthalene), and cyclic saturated hydrocarbons (e.g., cyclohexane and cyclohexanol). According to particular embodiments, the supercritical fluid solvent is a substance such as carbon dioxide that does not easily transfer or conduct an electrical charge. A feature of the presently disclosed methods is that several of the supercritical fluid solvents are environmentally benign such as carbon dioxide, xenon, argon, chlorodifluoromethane, and water. The critical temperature and critical pressure for achieving a supercritical fluid state is generally known for each of the above-described solvents. The critical temperature and critical pressure for other solvents can be determined by techniques known in the art. With respect to the supercritical fluid solution resulting from mixing the solute with the solvent, the critical temperature and critical pressure may be approximately the same for the pure solvents but could deviate as the solute concentration increases. The supercritical solution typically is a substantially single-phase solution that is above the critical density of the substantially pure supercritical fluid solvent.

At least one optional secondary solvent may be included in the solution provided it does not interfere with maintaining the solution in a supercritical fluid state. Illustrative secondary solvents include acetone, methanol, ethanol, water, pentane, and acetic acid. Such secondary solvents typically would not be included in an amount greater than 10 weight percent of the total mixture or solution. Other optional additives may be included in the solution such as surfactants, chelates, and organometallic compounds.

The types of substrates that may be coated are not critical and may vary widely. Any conducting, semi-conducting or insulating material should be suitable. If an insulating substrate is utilized, the deposited particles should be conducting or semi-conducting. Illustrative substrates include molded articles made from elastomers or engineering plastics, extruded articles such as fibers or parts made from thermoplastics or thermosets, sheet or coil metal goods, ceramics, glass, substrates previously coated with a metallic or polymeric material, and the like. Examples of substrate devices include medical devices such as stents and microelectronic devices such as semiconductor chips.

Illustrative elastomeric substrate materials include natural rubber or synthetic rubber such as polychloroprene, polybutadiene, polyisoprene, styrene-butadiene copolymer rubber, acrylonitrile-butadiene copolymer rubber ("NBR"), ethylene-propylene copolymer rubber ("EPM"), ethylene-propylene-diene terpolymer rubber ("EPDM"), butyl rubber, brominated butyl rubber, alkylated chlorosulfonated polyethylene rubber, hydrogenated nitrile rubber ("HNBR"), silicone rubber, fluorosilicone rubber, poly(n-butyl acrylate), thermoplastic elastomer and the like as well as mixtures thereof.

Illustrative engineering plastic substrate materials include polyester, polyolefin, polyamide, polyimide, polynitrile, polycarbonate, acrylic, acetal, polyketone, polyarylate, polybenzimidazoles, polyvinyl alcohol, ionomer, polyphenyleneoxide, polyphenylenesulfide, polyaryl sulfone, styrenic, polysulfone, polyurethane, polyvinyl chloride, epoxy and polyether ketones.

Illustrative metallic substrate materials include iron, steel (including stainless steel and electrogalvanized steel), lead, aluminum, copper, brass, bronze, MONEL metal alloy, nickel, zinc, tin, gold, silver, platinum, palladium and various alloys of such materials.

Further substrate materials include silica, alumina, concrete, paper, and textiles.

The presently disclosed methods can be used to generate a solid matrix with nanometer size amorphous domains of two or more chemically diverse solid materials. For example, more than one solute substance could be mixed with the supercritical fluid solvent. In particular, materials that are insoluble with each other in the solid state or that are not both soluble in conventional organic solvents or water may be mixed and sprayed together resulting in a solid nanoscale dispersion or matrix of the materials. Alternatively, a plurality of different materials could be dissolved in separate chambers holding supercritical fluid solvents. The sprays from each distinct supercritical fluid solution could be mixed during electrostatic deposition to produce a solid nanoscale dispersion or matrix of the materials. This variant might be useful for producing a coating of a polymer matrix that incorporates a pharmaceutical substance. The polymer-containing supercritical solution could be prepared in one chamber at a higher temperature (e.g., from about 100° C. to about 250° C.) and the fragile or labile pharmaceutical-containing supercritical solution could be prepared in a second chamber at a lower temperature (e.g., from about 25° C. to about 100° C.). Alternate layers of materials also could be sprayed to produce coatings with multi-tailored properties.

The presently described electrostatic deposition processes also could be utilized for collecting bulk powders having nanometer-sized particles such as various pharmaceutical substances. For example, a series or arrays of large surface area electrodes could be used to accumulate the charged particles. Electrostatic deposition can be continued for a longer period of time with such electrode arrays. At periodic intervals, particle powder can be removed by mechanical means such as scraping or imparting vibrations and then collected in a suitable container.

Any devices capable of providing the rapid expansion of the supercritical fluid solution can be employed to perform the electrostatic deposition methods. A representative example of a suitable apparatus is shown in FIG. 1. An additional example of a RESS apparatus is shown in U.S. Pat. No. 4,582,731 (see FIGS. 4–6). In general, the supercritical solvent is pumped and/or heated to the desired pressure and/or temperature resulting in a supercritical fluid state. The solute material can be mixed with the supercritical fluid solvent via any known mixing techniques such as extraction, baffle mixing, impinging jet mixers, or a magnetic stir bar. The resulting supercritical fluid solution is introduced into at least one orifice or other configuration that can cause a rapid expansion of the solution. The orifice may have an elongated or cylindrical geometry such that the supercritical fluid solution flows through a narrow passage. In particular embodiments, the orifice is a capillary. A nozzle defining one or more orifices may be utilized. The dimensions of the orifice may vary depending upon the materials and the desired pressure drop. For example, the length of the orifice may be from about 50 microns to about 5 mm long. The orifice opening may have any geometry but typically is generally circular or oval. The largest dimension of the orifice opening may vary such as, for example, from about 10 microns to about 1000 microns. In the case of a capillary, the capillary may have a length of about 1 cm to about 200 cm. The distance from the orifice outlet to the substrate surface may vary depending upon the specific configuration, desired coating area, field strengths, and material. For example, the distance may range from about 2 cm to about 200 cm.

With reference to FIG. 1, a container 1 for holding the supercritical fluid solvent is fluidly coupled to a pump 2. The pressure of the supercritical fluid solvent may be increased to the desired level via the pump 2. A pressurized vessel 3 is fluidly coupled to the pump 2 so that the pressurized vessel 3 can receive the supercritical fluid solvent 4. Heating means (not shown) may be provided for the pressurized vessel 3. A solute substance 5 is dissolved in the supercritical fluid solvent 4 in the pressurized vessel 3. Alternatively, the solute substance 5 may be mixed with supercritical fluid solvent 4 under conditions that are initially insufficient to induce a supercritical fluid solution, but the resulting mixture is subsequently subjected to pressure and/or temperature conditions sufficient for formation of the supercritical fluid solution. A magnetic stir bar 6 is provided to thoroughly mix the solute substance 5/supercritical fluid solvent 4 mixture resulting in a supercritical fluid solution. A wall of the pressurized vessel 3 defines an outlet 7 for discharging the supercritical fluid solution through a capillary restrictor nozzle 8. The capillary restrictor nozzle 8 may be constructed from an electrical insulator material such as quartz or polyetheretherketone. A proximate end 14 of the capillary restrictor nozzle 8 may be immersed in the supercritical fluid solution. The capillary restrictor nozzle 8 may be heated to avoid plugging by solute precipitate. More than one nozzle may be provided. A first electrode 9 of a power source 11 is coupled to a distal end 10 of the capillary restrictor nozzle 8. A second electrode 12 of the power source 11 is coupled to a substrate 13. The first and second electrodes 9, 12 may be any structure known in the art such as wires, plates, clips, and the like. For example, the first electrode 9 may be a metal wire that extends beyond the distal end 10 of the capillary restrictor nozzle 8 and is secured thereto by suitable means. Alternatively, the first electrode 9 may be an annular ring that encompasses the distal end 10 of the capillary restrictor nozzle 8. The first electrode 9 may be aligned in any orientation with respect to the spray of RESS particles. In the case where the first electrode 9 is an annular ring, the plane in which the annular ring lies is aligned substantially parallel to the plane formed by the exit surface of the capillary restrictor nozzle 8.

The supercritical solution undergoes RESS as it flows through and exits the capillary restrictor nozzle 8. A spray of RESS particles 15 exits the distal end 10 of the capillary restrictor nozzle 8. A voltage is applied to the first and second electrodes 9, 12. The electric potential difference between the first electrode 9 and the second electrode 12 attracts the RESS particles 15 to the substrate 13. The solvent gas may be removed from the deposition field by simply providing a suitable gas flow. A chamber (not shown) enveloping the capillary restrictor nozzle 8 and the substrate 13 may be provided to enhance formation of the RESS particles. For example, an insulator such as a glass bell jar may encompass the capillary restrictor nozzle 8 and the substrate 13. An insulator material provides a superior configuration for precisely controlling the grounding or charging of the substrate. The interior of the chamber may be at atmospheric or sub-atmospheric pressure. Spraying or discharging into an atmospheric ambient avoids the potentially costly effort of maintaining a subatmospheric pressure.

The specific examples described below are for illustrative purposes and should not be considered as limiting the scope of the appended claims.

EXAMPLE 1

Supercritical carbon dioxide solutions of three different fluoropolymer were used to generate different types of coatings on assorted substrates. The first was a copolymer of tetrafluoroethylene/hexafluoropropylene (19.3%) (TFE/HFP) whose solubility in $CO_2$ has been previously reported by Tuminello et al., *Dissolving Perfluoropolymers in Supercritical Carbon Dioxide*, Macromolecules 1995, 28, 1506–1510 and Rindfleisch et al., *Solubility of Polymers and Copolymers in Supercritical* $CO_2$, J. Phys. Chem. 1996, 100, 15581–15587. The second was a copolymer of tetrafluoroethylene/hexafluoropropylene/vinylidene fluoride (THV 220A) that was used as received from Dyneon LLC, 6744 $33^{rd}$ Street North, Oakdale, Minn. 55128. This polymer has a reported melting point of 120° C. The third polymeric material, poly(1,1-dihydroperfluorooctylacrylate) or PFOA, was synthesized using methods described in DeSimone et al., Science 1992, 257, 945–947. Each of these materials was dissolved in supercritical $CO_2$ and sprayed using the apparatus depicted in FIG. 1. A fused silica capillary restrictor nozzle (50 μm diameter, 10 cm length) was employed.

The THV material was dissolved in $CO_2$ (5 mg/ml) at 110° C. and 900 bar and sprayed through the capillary restrictor nozzle. The TFE/HFP material (5 mg/ml) was dissolved at 245° C. and 1000 bar and sprayed through the capillary restrictor nozzle. The PFOA material (0.06 mg/ml) was dissolved at 70° C. and 310 bar and sprayed through the capillary restrictor nozzle. In each instance, the pressurized vessel 3 was heated to the desired temperature for each polymer and allowed to fully equilibrate. The pressurized vessel 3 then was filled with $CO_2$ to the desired pressure for initiating the RESS spray. After a brief equilibration time, the magnetic stir bar 6 is activated to vigorously mix the solution which is then a homogeneous, clear solution in a few seconds. The duration of the spraying was about 2–3 minutes under an applied voltage of 15 kV. The substrates are positioned off-axis at a distance of about 10 cm from the distal end 10 of the capillary restrictor nozzle 8.

Figure 2A:
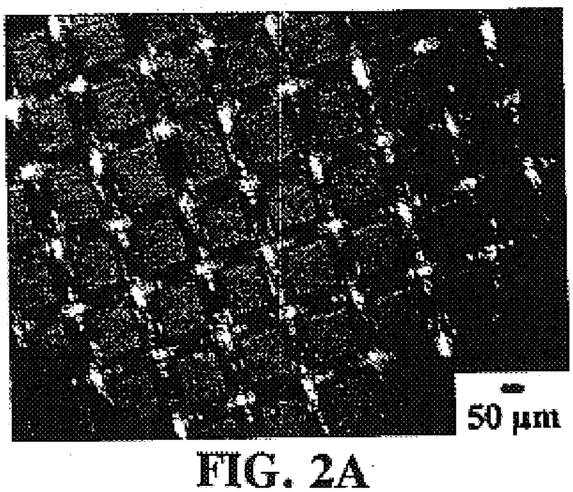
FIG. 2A is an optical micrograph of an uncoated substrate.
Figure 2B:
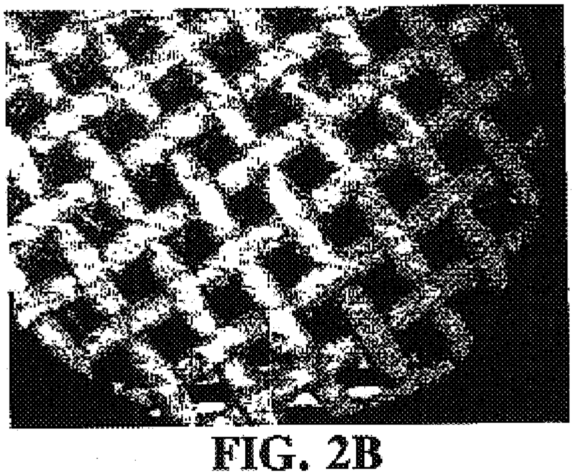
FIGS. 2B and 2C are optical micrographs of substrates coated with electrostatically deposited RESS particles.
Figure 2C:
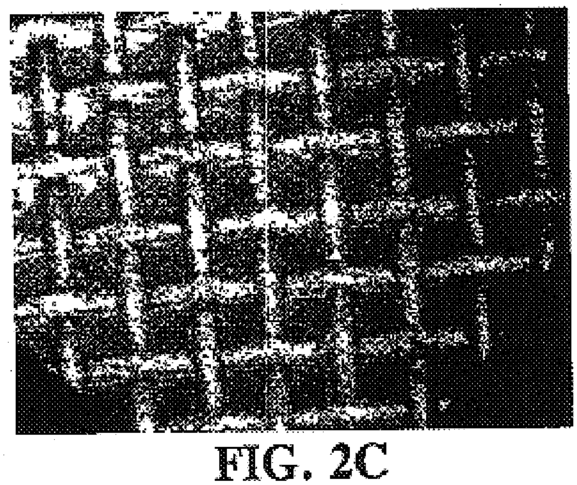

FIGS. 2A–2C are optical micrographs of uncoated (FIG. 2A) and coated (FIGS. 2B and 2C) wire screens having very fine mesh size. The screens were coated with THV. For the coated screen (FIG. 2B), the coating appears as a uniform white mat. At the highest possible optical magnification (not shown), no individual particles can be resolved meaning that their size is below 500 nm. As shown in FIG. 2B, the particle layer partially occults the opening of the screen and from this dimensional change we can estimate that the mat of particles has a thickness of about 8 microns. The coating thickness as determined from gravimetric measurements is about 4 μm thick for a fully dense polymer layer. FIG. 2C shows the FIG. 2B particle coating after sintering the polymer particles in a vacuum oven at 100° C. for 3 hours. In this case the individual polymeric particles have collapsed into a film that uniformly coats all of the topographical features of the screen.

EXAMPLE 2

A fluorescent organic compound, coumarin 153, was mixed into the supercritical fluid solution with the THV polymer at a dye-to-polymer mass ratio of 1:20 at the conditions described above. These materials by themselves do not form a solid solution. A uniform particle matrix coating was again generated but in this case the coating had a distinct yellow hue characteristic of the dye. Under a high-power fluorescence microscope the coating was strongly fluorescent although individual dye particles cannot be resolved. A rapid photo-bleaching (approximately 5 sec half life) of the coating was visually observed, possibly because of the finely divided nature of the dye particles.

EXAMPLE 3

The RESS process for the TFE/HFP polymer was adjusted to produce a mixture of ultra-fine fibers and particles. In this case, the pressure of the supercritical solution in the pressurized vessel 3 upstream of the capillary restrictor nozzle 8 was just slightly above the cloud point pressure. Under these conditions a phase separation occurs within the capillary restrictor nozzle 8 generating a polymer-rich liquid phase that wets the wall of the capillary. Upon exiting the capillary tip, this viscous liquid phase is drawn into ultra-small fibers. Since the screen is positioned away from the high-velocity RESS jet, the fiber migration to this substrate is primarily driven by the electrostatic forces as is the case for the ultra-small particles.

EXAMPLE 4

A coating of PFOA was electrostatically applied to a surface acoustic wave device. In this example the electrode of the high voltage supply was connected to a set of alternating pairs of aluminum electrodes. The capillary restrictor was a 15 cm long piece of polyetheretherketone tubing having an inside diameter of 65 microns and an outside diameter of 1.6 mm. The flow rate of the supercritical solution was 5 ml/min.

The result was that only the aluminum electrodes connected to the voltage supply during the spraying are coated whereas adjoining pairs of electrodes are not coated. There was 100% selectivity for the connected Al electrodes. The polymer deposition was restrained to only the electrically conducting regions with a spatial resolution better than 50 nm. In this case the starting polymer concentration is about 100 times smaller than for the examples described above resulting in much smaller particles estimated to be well below 100 nm in diameter. Furthermore, the surface of this electronic device was protected with a 50 nm thick layer of silica. Thus, the charge leakage through this coating is sufficient to maintain a highly specific local field. The surface acoustic wave device was conducive to accurately measuring coating thickness by determining changes in the frequency of the surface wave. The measured thickness corresponds to a 30 nm thick coat on the electrode surfaces.

EXAMPLE 5

Figure 3A:
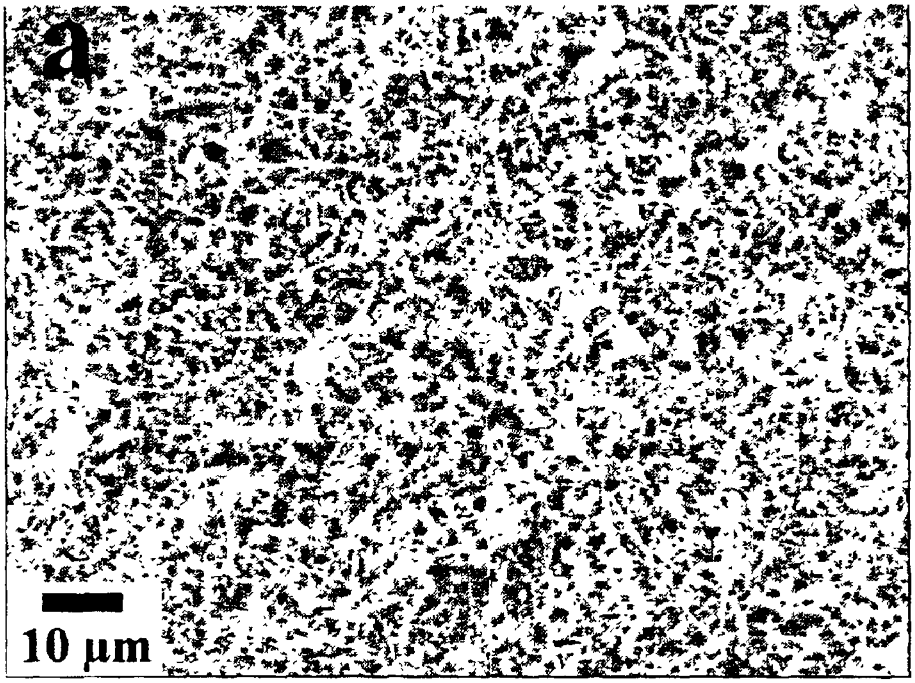
FIGS. 3A, 3B and 3C are optical micrographs of a further substrate type coated with electrostatically deposited RESS particles.
Figure 3B:
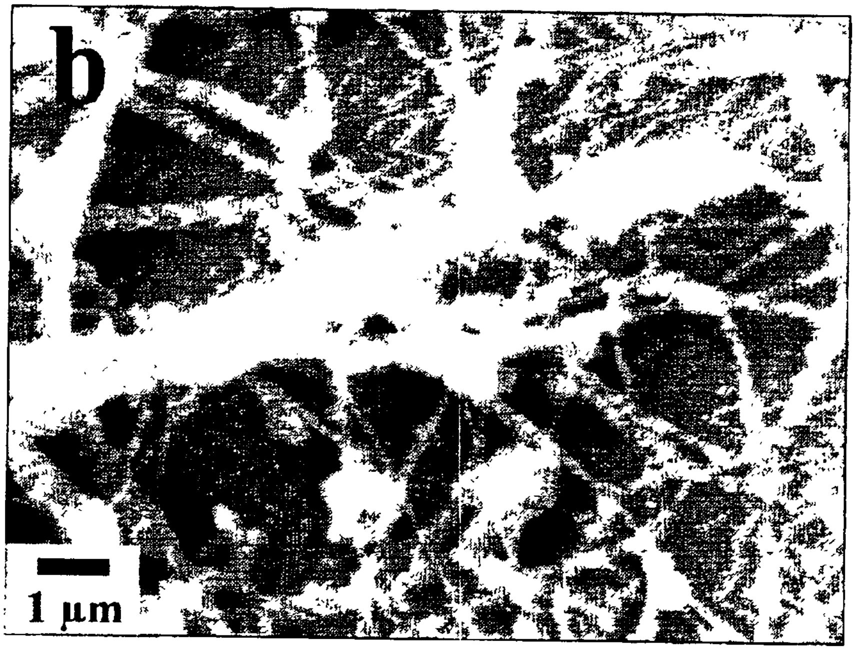
Figure 3C:
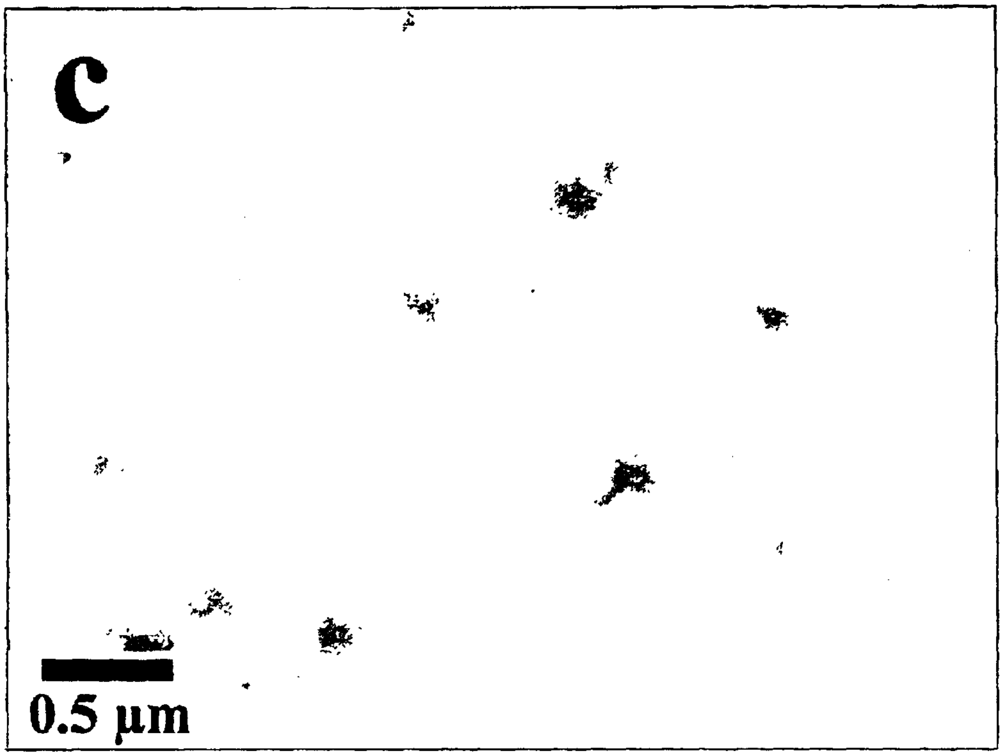

In this example, the substrate was a piece of a silicon wafer having an optically polished surface. An electrode was attached to one edge of the wafer. The THV 220A polymer (1.6 mg/ml or 0.6 mg/ml) was dissolved in $CO_2$ at 145° C. and 15,000 psi. The spray was established and 15 kV potential was applied to the electrodes for about 10 seconds. A substantially uniform coating was produced on the wafer. For example, FIGS. 3A and 3B show a coating of nanofibers on the wafer substrate resulting from electrostatically depositing the THV 220A at a concentration of 1.6 mg/ml. FIG. 3C shows nanometer-sized particles coated on the wafer substrate resulting from electrostatically depositing the THV 220A at a concentration of 0.6 mg/ml.

The electrode that was connected to the wafer substrate was a clip device covered with a shell of 1 mm thick polyethylene. It was observed that the covering was coated with the THV 220A polymer particles since the underlying metal electrode generates an electric field at the surface of the polyethylene shell.

Having illustrated and described the principles of the disclosed methods and substrates with reference to several embodiments, it should be apparent that these methods and substrates may be modified in arrangement and detail without departing from such principles.

What is claimed is:

1. A method for depositing a substance on a substrate, comprising:

forming a supercritical fluid solution that includes at least one supercritical fluid solvent and at least one solute;

discharging the supercritical fluid solution through an orifice under conditions sufficient to form solid particles of the solute that are substantially free of the supercritical fluid solvent;

charging the solid solute particles to a first electric potential; and depositing the charged solid solute particles onto a substrate.

2. The method of claim 1, wherein the solid solute particles are substantially spherical, irregularly-shaped, rod-shaped or fiber-shaped.

3. The method of claim 1, wherein the solid solute particles electrostatically deposited onto the substrate initially form a coating of individual solid solute nanoparticles that subsequently coalesce with adjacent solid solute nanoparticles to form a film.

4. The method of claim 1, wherein the solid solute particles electrostatically deposited onto the substrate form a film.

5. The method of claim 1, wherein the solute comprises an inorganic substance.

6. The method of claim 1, wherein the supercritical fluid solvent comprises water.

7. The method of claim 1, wherein the substrate is electrically grounded.

8. The method of claim 1, further comprising providing a first electrode that can generate an electrical field for charging the solid solute particles to the first electric potential.

9. A method for depositing a substance on a substrate, comprising:

forming a supercritical fluid solution that includes at least one supercritical fluid solvent and at least one solute;

discharging the solution through an orifice under conditions sufficient to form particles of the solute having a mean particle size of less than 1 micron; and electrostatically depositing the solute particles onto the substrate.

10. The method of claim 9, further comprising charging the solute particles to a first electric potential.

11. A substrate comprising a coating on at least one surface of the substrate formed according to the method of claim 1.

* * * * *